United States Patent [19]

Zhuang et al.

[11] Patent Number: 5,287,213

[45] Date of Patent: Feb. 15, 1994

[54] BARIUM STRONTIUM TITANATE PHOTOREFRACTIVE DEVICE AND METHOD FOR MAKING THE SAME

[75] Inventors: Jian Zhuang; Gansheng Li; Xiancheng Gao; Xibin Guo; Yihao Huang; Zhenzhu Shi; Yaying Weng; Jian Lu, all of Fuzhou, China

[73] Assignee: Fujian Institute of Research on the Structure of Matter, Chinese Academy of Sciences, China

[21] Appl. No.: 17,350

[22] Filed: Feb. 11, 1993

Related U.S. Application Data

[63] Continuation of Ser. No. 730,558, Jul. 16, 1991, abandoned.

[30] Foreign Application Priority Data

Jul. 26, 1990 [CN] China .................. 90 1 04945.X

[51] Int. Cl.$^5$ .................. G02B 5/14; G02B 5/23; G03H 1/02
[52] U.S. Cl. .................. 359/244; 359/276; 359/300; 372/21; 385/5; 385/122

[56] References Cited

U.S. PATENT DOCUMENTS

| 4,099,836 | 7/1978 | Baues et al. ..................... | 359/341 |
|---|---|---|---|
| 4,677,083 | 6/1987 | Uedaira et al. ..................... | 423/598 |
| 4,724,038 | 2/1988 | Pastor et al. ..................... | 423/593 |
| 4,773,739 | 9/1988 | Valley et al. ..................... | 359/300 |
| 4,853,199 | 8/1989 | Inoue et al. ..................... | 423/593 |
| 5,038,359 | 8/1991 | Pepper et al. ..................... | 359/300 |
| 5,084,424 | 1/1992 | Abe et al. ..................... | 501/137 |

OTHER PUBLICATIONS

Hribek, P; Gsk. Cas. Frz. A. (Czech.), vol. 38, #5, pp. 473–483, 1988; abst. only supplied.

Feinberg, J; Opt. Lett., vol. 7, #10, pp. 486–488, Oct. 1982; abst. only suuplied.
Gower et al; J. Opt. Soc. Am. B., Opt. Phys., vol. 5, #8, pp. 1750–1707, Aug. 1988; abst. only supplied.
Ueda, S; Matter Res. Bull., vol. 9, #4, Apr. 4, 1974, pp. 469–476; abst. only Supplied.
J. A. Basmajian & R. C. DeVries, Phase Equilibria in the system $BaTiO_3$–$SrTiO_3$, Journal of the American Ceramic Society, vol. 40, No. 11, pp. 373–376.
D. Rytz et al, Growth of $Ba_{1-x}Sr_xTiO_3$ Single Crystals, Japanese Journal of Applied Physics, vol. 24 (1985) Supplement 24-2, pp. 622–624.
S. Ueda, Crystal Growth and Dielectric Properties of Barium Strontium Titanate $Ba_{0.97}Sr_{0.03}TiO_3$, Materials Research Bulletin, vol. 9, pp. 469–476 1974).

Primary Examiner—Nelson Moskowitz
Attorney, Agent, or Firm—Ladas & Parry

[57] ABSTRACT

The invention relates to a photorefractive device made of single crystal of which the chemical composition substantially is $Ba_{1-x}Sr_xTiO_3$ ($0.01<x<0.1$ BST) The method for manufacturing said device comprises: growing BST single crystal by Czochralski technique; annealing said crystal in oxidizing atmosphere; machining said crystal into cuboid with polished surfaces; poling said cuboid mechanically and electrically into single-domain state. Said device may ba a piece of said single-domain crystal, or an optoelectronic assembly including at least one of said crystal as the core part. Performances of said device are similar to the one made of $BaTiO_3$. A reflectivity as high as 52% has been reached using said device as a self-pumped phase conjugator. Compared to $BaTiO_3$, the method for manufacturing BST crystal according to the invention has advantages such as shorter typical growth period of 3–4 days, simpler requirement for equipment and technique, higher yield, and easier to obtain crystal cuboid with larger dimensions.

1 Claim, 1 Drawing Sheet

5,287,213

BARIUM STRONTIUM TITANATE PHOTOREFRACTIVE DEVICE AND METHOD FOR MAKING THE SAME

This is a divisional of copending application(s) Ser. No. 07/730,558 filed on Jul. 16, 1991.

1. FIELD OF THE INVENTION

This invention relates to the photorefractive devices made of single crystals of barium strontium titanate, of which the chemical composition substantially is $Ba_{1-x}Sr_xTiO_3$ (0.01 < x 0.1. BST).

2. BACKGROUND OF THE INVENTION

Photorefractive device is a nonlinear optical device based on the photorefractive effect of material. It may be a piece of photorefractive crystal processed by certain technique, or an optoelectronic assembly including at least one piece of photorefractive crystal as the core part.

The fundamentals of the photorefractive device can be found in many public materials such as "Photorefractive Materials and Their Applications I and II" edited by P. Gunter and J.-P. Huignard, Topics Appl. Phys. Vol. 61 and 62 (Springer-Verlag, Berlin, Heidelberg, 1988 and 1989).

One group of most important photorefractive materials is the ferroelectric oxide crystal, among which tetragonal-phase $BaTiO_3$ has the best photorefractive properties. The particular advantage of $BaTiO_3$ is that the photorefractive effect is very large and it can produce a phase conjugate beam using self-pumping mechanism. One of the main disadvantages of $BaTiO_3$ crystal is to have the difficulty in obtaining of single crystal which has desirable size and optical quality due to the existence of a hexagonal phase above 1460° C. Single crystals of $BaTiO_3$ are normally grown by TSSG technique, of which the growth period is typically 20~30 days, the equipment and technological requirements are complicated, and yield is low.

$BA_{1-x}Sr_xTiO_3$ is a mixed oxide crystal. In the region of x<0.3, $Ba_{1-x}Sr_xTiO_3$ crystal is tetragonal. ferroelectric phase (space group $P_4 mm-C^1_{4v}$) at room temperature. Upon heating, it transforms to a cubic, paraelectric phase (space group $Pm3m-O^t_h$) at the Curie temperature Tc. The value of Tc depends on the value of x.

The phase diagram of $BaTiO_3$—$SrTiO_3$ system has been reported by J. A. Basmajian and R. C. DeVries in Journal of the American Ceramic Society, Vol. 40, P. 373 (1957). They found that the BaTiO—SrTiO system is characterized by a complete series of solid solutions and the hexagonal phase is suppressed to a region extending no farther than 0.5% $SrTiO_3$. Thus, for x>0.005, $Ba_{1-x}Sr_xTiO_3$ can be grown from the melt. Since then, several efforts have been reported in literature to grow $Ba_{1-x}Sr_xTiO_3$ single crystals with different value of x by czochralski method or solvent zone melting technique (e.g. D. Rytz et al. Japanese Journal of Applied Physics, Vol. 24 supplement 24-2, P. 622 (1985); R. M. Henson and A. J. Pointon, Journal of Crystal Growth vol. 26, P. 174 (1974)). So far, there has been no report on obtaining of $Ba_{1-x}Sr_xTiO_3$ single crystal suitable for measurement of their photorefractive properties. And also no one has reported that $Ba_{1-x}Sr_xTiO_3$ crystal possesses good photorefractive properties or can be used to construct a photorefractive device.

3. SUMMARY OF THE INVENTION

The first object of the present invention is to provide a photorefractive device made of other material than $BaTiO_3$ single crystal with performance as good as that of $BaTiO_3$ single crystal.

The second object of the present invention is to provide a technique to manufacture the above-mentioned device.

The first object of the present invention is achieved by the photorefractive devices employing barium strontium titanate single-domain crystal of which the chemical composition substantially is $Ba_{1-x}Sr_xTiO_3$ (BST) with 0.01 < x < 0.1.

The second object of the present invention is achieved by following steps:

(1) growing single crystals of BST by using Czochralski technique with starting materials which substantially comprise BaO, SrO and $TiO_2$ or the compounds which can be decomposed into BaO, SrO and $TiO_2$ at high temperature;

(2) annealing the as-grown crystal under high temperatures:

(3) cutting the crystals to cuboid and grinding it along {100} planes:

(4) poling the crystal into single-domain one after polishing the surfaces of the crystal cuboid.

The performances of photorefractive device made of the BST single crystal obtained by using the method of the present invention are similar to that of one made of $BaTiO_3$. However, boule of BST single crystal with dimensions of approximately $\phi$40 mm × 15 mm can be obtained in a typical growth period of 3–4 days, from which more than 10 pieces of single crystal cuboid with dimensions of 5 mm × 5 mm × 5 mm can be obtained.

Furthermore, both $BaTiO_3$ and BST crystals have a tetragonal-to-orthohombic phase transition temperature (Ts) below the room temperature. It is necessary to keep the temperature of the crystal being higher than the phase transition temperature (Ts) during the period of maintenance and operation. The Ts of $BaTiO_3$ was reported to be 9° C. ~13° C. For BST, it has been measured that in the range of x<0.1, when the value of x increases by 0.01 the temperature Ts will decrease 1.6° C. This decreasing of temperature Ts enables the maintenance and operation of BST crystal and device more convenience.

4. BRIEF DESCRIPTION OF DRAWINGS

5. DETAINED DESCRIPTION OF THE INVENTION

Figure 1:
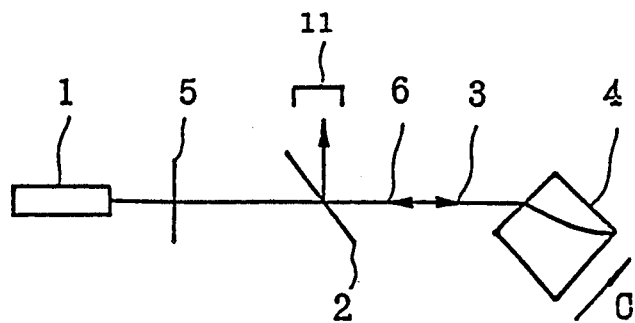
FIG. 1 is a diagram illustrating the use of BST crystal as a self-pumped phase-conjugator.
Figure 2:
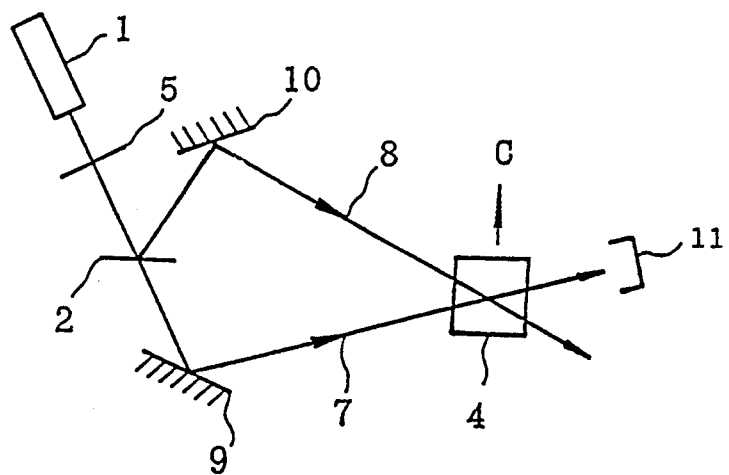
FIG. 2 is a diagram illustrating the experimental set-up of two-beam coupling with BST crystal as a single amplifier.

The inventors have firstly discovered that single-domain crystal of BST possesses excellent photorefractive properties, and the photorefractive device made of BST crystal can realize self-pumped phase conjugation within the wavelength range from 450 nm to 650 nm. The self-pumped phase conjugate reflectivity (without correction for Fresnel losses) as high as 52% has been reached at 5.14.5 nm for the photorefractive device of BST crystal which is schematically illustrated in FIG. 1. A single amplifier made of the BST crystal has been characterized by two-beam coupling experiments. The experimental set-up is sketched in FIG. 2. An argon-ion laser 1 operating at 514.5 nm on a TEMoo mode was used as the light source. Signal beam 7 and pump beam 8 were obtained by the beam splitter 2 and two mirrors 9 and 10. The beams were polarized parallel to the plane of intersection and so were extraordinary rays in the crystal 4. with an intensity of pumped beam of 20 mw and a signal/pump intensity ratio of 1:2000, the effective gain of the signal beam and the exponential power gain coefficient as high as 500 and 12 cm$^{-1}$, respectively, have been reached.

The method for manufacturing a BST of the invention is described in detail as follows:

(1) CRYSTAL GROWTH

BST single crystal can be obtained by various methods such as Czochralski method Bridgman method and the travelling solvent zone technique The starting materials are composed substantially of BaO, SrO and TiO$_2$ or any compounds which can be decomposed into BaO, SrO and TiO$_2$ at high temperature. The starting materials are homogeneously mixed and pressed into tablets and sintered at high temperature before they are placed in the crucible.

When the electromagnetic induction furnace is used, the frequency of the electromagnetic field is preferably in the range of 1-10 kHz. The crucible is made of iridium and nitrogen or argon gas with pressure of $10^4 \sim 10^5$ Pa is filled into the furnace as the protective atmosphere Seeds with {100} or {110} or {111} faces are attached to the pulling mechanism and rotating at 2-10 rpm. The charge is melted and soaked for several hours and then slowly cooled to the nucleation temperature with the seed touching the melt. The pulling rate is 0.1~0.5 mm/h. When the desired dimensions of the crystal boule are reached, the crystal is pulled out of the melt and then cooled slowly to room temperature.

(2) POSTGROWTH ANNEALING

As-grown crystal is annealed in oxidizing atmosphere at 600-1500° C. The heating and cooling rate should not exceed 5° C./h in the temperature range of Tc±10° C.

(3) CRYSTAL CUTTING, GRINDING AND POLISHING

After annealing, the crystal is oriented by X-ray diffraction technique and cut into rectangulars with the surfaces parallel to {100} crystallographic planes. The six surfaces of the crystal are ground and polished with 3 $\mu$m to 1 $\mu$m diamound or Ce$_2$O$_3$ powder.

(4) CRYSTAL POLING

Polished crystal is then mechanically and electrically poled to remove 90° and 180° ferroelectric domain walls.

Uniaxial and homogeneous pressure is applied along the direction of each a-axis of the crystal alternatively, to eliminate 90° domain walls. The desirable value of pressure depends on the quality of the crystal. Normally, it does not exceed 10$^7$ Pa. In order to remove all visible 90° domain walls, it is required to repolish and squeeze the crystal iteratively.

Once all visible 90 domain walls are removed the crystal are mounted between two polished metal electrods with c-axis perpendicular to the surfaces of the electrods, and immersed into dielectric oil (e.g. silicone oil) in order to eliminate 180° domains. The temperature is raised to a temperature 1~10° C. lower than Curie temperature Tc, and an electric field of 1-7 kv/cm is gradually applied at a raising rate of about 10v/min. The desirable value of the electric field intensity depends on the quality of crystal and the temperature used. The field and temperature is maintained for several hours. Cooling the crystal slowly to the room temperature in the presence of the electric field, then the field is removed.

The crystal cuboid is now fully poled to be in single domain state and can be used as a photorefractive device or the core part of a photorefractive device. When it is used as a self-pumped phase conjugation device, the incident light should be a linearly polarized beam with wavelength $\lambda$=450 nm~650 nm. The light beam is incident upon one of a-faces. Both the incident plane and polarization plane parallel to the other a-face The angle between the incident beam and the c-axis of the crystal is preferably from 30° to 40°.

Self-pumped phase conjugate reflectivities (without corrections for Fresnel losses) obtained by using so resulted devices are all larger than 40%.

The performance of the BST photorefractive device according to the present invention is as good as that of BaTiO$_3$. However, BST crystal according to the present invention has the following merits:
a). easy growth, b). simple requirement for equipment, c). short growth period, d) easy achievement of crystal with lager dimensions and f). lower Ts.

EXAMPLE 1

The raw materials of 11.07 g SrCO$_3$, 577.21 g BaCO$_3$ and 239,64 g TiO$_2$ powder were mixed homogeneously, pressed into tablets, sintered at 1300° C. for 10 hours, and melted inductively in an iridium crucible (80 mm in diameter and 60 mm in height) in a nitrogen atmosphere (5×10$^4$ Pa). The frequency of the induction furnace was 5 kHz. The direction of the seed is [100]. The charge was heated to 1665° C. for 8 hours and cooled down to about 1585° C., at which temperature the seed rotating at 10 rpm was brought into contact with the melt, and pulled at a rate of 0.05 mm/h. When the diameter of the crystal reached to 40 mm, the pulling rate was changed to 0.2 mm/h for 50 hours and then the crystal was pulled out of the melt. Subsequently the crystal was cooled to room temperature within 24 hours. A crack-free single-crystal boule with dimensions $\phi$40 mm×13 mm and dark blue color was obtained. The concentration of Sr in the resulting crystal is determined to be x=0.048 and the curie temperature of the crystal is about 110° C. determined by the dielectric constant measurements.

The crystal was annealed in air in an annealing furnace. The temperature of the crystal was raised from room temperature to 1000° C. in 24 hours. The temperature of the crystal was maintained at 1000° C. for 42 hours and then cooled to room temperature in 64 hours. The heating and cooling rate was controlled to be 5° C./h in the temperature range from 100° C. to 120° C. The color of the resulting crystal become light yellow after annealing.

EXAMPLE 2

The raw materials of 6.64 g SrCO$_3$, 583.13 g BaCO$_3$ and 239.64 g TiO$_3$ powder were mixed homogeneously, pressed into tablets, sintered at 1300° C. for 10 hours, and melted inductively in an iridium crucible (80 mm in diameter and 60 mm in height) in a nitrogen atmosphere (5×10$^4$ Pa). The frequency of the induction furnace was 5 kHz. The seed orientation is [100]. The charge was heated to 1665° C. for 8 hours and cooled down to about 1600° C. At the latter temperature, the seed was brought into contact with the melt, rotating at 10 rpm. When the diameter of the crystal reached to about 40 mm, the pulling was initiated at a rate of 0.3 mm/h. After 30 hours, the crystal was pulled out of the melt. Then the crystal was cooled to room temperature within 24 hours, and a crack-free single-crystal boule with dimensions $\phi 88$ mm $\times$ 12 mm and dark blue color was obtained. The concentration of Sr in the resulting crystal is determined to be $x=0.020$ and the Curie temperature of the crystal is about 122° C.

The crystal was annealed in air in an annealing furnace The temperature was raised from room temperature to 1000° C. in 24 hours, and maintained at 1000° C. for 42 hours, then cooled to room temperature in 64 hours. The heating and cooling rate was controlled to be 5° C./h in the temperature range from 112° C. to 132° C. The color of the crystal became light yellow after annealing.

EXAMPLE 3

The crystal obtained by the procedures of examples 1 and 2 were oriented by X-ray diffraction technique, and cut and ground to obtain two cuboids with the surfaces parallel to (100), (010), (001) planes, respectively, to accuracies of $\pm 1°$. The dimensions of the cuboids were 5.15 $\times$ 5.63 $\times$ 5.38 mm$^3$ and 5.09 $\times$ 5.67 $\times$ 4.92 mm$^3$, respectively, with the c-axis parallel to the first dimension.

After polishing the cuboids with 1.5 $\mu$m Ce$_2$O$_3$ powder, they were placed between two platens in a presser with one of the a-axes perpendicular to the platens, and pressed with a pressure of about 10$^7$ Pa for 4 hours. The same procedure was then done with the other a-direction. All the six surfaces of the cuboids were repolished and the crystals were repressed. After repeating above procedure for three times, all the visible 90° domain walls were removed.

The crystal was mounted between two polished brass electrodes (measured $\phi 18$ mm) with c-axis perpendicular to the surface of electrods, and was immersed into silicone oil in a small vessel. The vessel was placed in a furnace and the temperature was raised at a rate of 50° C./h. When the temperature reached to 90° C., the heating rate was changed to 20° C./h. The final temperature was 106° C. for the crystal obtained in example 1 and 118° C. for the one obtained in example 2. A DC voltage of 1650V was gradually applied on the crystal through the electrods with a rate of 10 V/min during the temperature was raising. The sense of electrods was arbitrarily selected. The final voltage and temperature was maintained for 12 hours and then the crystal was cooled down to room temperature at a cooling rate of 6° C./h Removing the voltage, the single-domain crystal cuboids were obtained, the color of which is slightly lighter than that of one before single-domain was realized.

EXAMPLE 4

The crystal cuboid obtained in examples 1 and 3 was used as a photorefractive self-pumped phase conjugation device (FIG. 1). The light source was an argon-ion laser 1 operating at 514.5 nm on a TEMoo mode. Through a beam splitter 2 with reflectance of 14%, the unfocused CW light beam 3 was incident upon one of the a-faces of the crystal 4 and polarized by passing through the half-wave plate 5 so that it entered the crystal as an extraordinary ray. The diameter of the incident beam 3 was 1 mm with intensity of 56 mw. The angle between the incident beam and the c-axis of the crystal was 35°.

The phase-conjugate light 6 created in the crystal was emerged in the direction opposite to the incident light beam and output after reflecting on the beam splitter. The phase-conjugate reflectivity was measured by the detector 11 to be 52% without correcting for Fresnel losses.

EXAMPLE 5

Using the crystal cuboid of examples 2 and 3 as a photorefractive self-pumped phase conjugation device (FIG. 1), and an argon-ion laser 1 operating at 514.5 nm on a TEMoo mode, a unfocused beam 3 was incident upon one of the a-faces of the crystal through a beam splitter 2 with reflectance of 14% placed between the light source and the crystal 4, and was polarized so that it entered the crystal as an extraordinary ray. The diameter of the incident beam 3 was 0.75 mm with intensity of 20 mw. The angle between the incident beam and the c-axis of the crystal was 35°. The phase-conjugate light 6 created in the crystal was emerged in the direction opposite to the incident light beam and output after reflecting on the beam splitter. The phase-conjugate reflectivity was measured by the detector 11 to be 48% without correcting for Fresnel losses.

The other kinds of photorefractive devices of BST are easily designed and fabricated in the similar ways. They are obviously not beyond the scope of our invention.

We claim:

1. A photorefractive device comprising means to direct at least one incident laser beam into at least one crystal having photorefractive properties to change the space distribution of the refractive index in said crystal whereby a phase conjugate beam is produced using self-pumped mechanism, wherein said crystal is a barium strontium titanate single-domain crystal, of which the chemical composition substantially is Ba$_{1-x}$Sr$_x$TiO$_3$ with $0.01 < x < 0.1$, said crystal being grown by using Czochralski technique and poled by the steps of mechanically applying uniaxial pressure on a polished crystal along the direction of each a-axis of the crystal alternatively, heating said crystal to a temperature of 1–10° C. lower than Curie temperature Tc, applying a DC electric field of 1–7 KV/cm, then cooling said crystal to room temperature in the presence of said electric field, and then removing the electric field.

* * * * *